(12) United States Patent
Huang et al.

(10) Patent No.: US 12,356,793 B2
(45) Date of Patent: Jul. 8, 2025

(54) LIGHT-EMITTING DEVICE HAVING COMPOSITE MATERIAL LAYER INCLUDING TITANIUM DIOXIDE NANOPARTICLE BONDED TO SULFUR ION OF AMINO ACID

(71) Applicant: TCL TECHNOLOGY GROUP CORPORATION, Huizhou (CN)

(72) Inventors: Panning Huang, Huizhou (CN); Zizhe Lu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 472 days.

(21) Appl. No.: 17/840,208

(22) Filed: Jun. 14, 2022

(65) Prior Publication Data

US 2022/0310961 A1    Sep. 29, 2022

Related U.S. Application Data

(63) Continuation of application No. PCT/CN2020/138807, filed on Dec. 24, 2020.

(30) Foreign Application Priority Data

Dec. 31, 2019   (CN) .......................... 201911423809.4

(51) Int. Cl.
   *H10K 50/165*   (2023.01)
   *H10K 30/15*    (2023.01)
   (Continued)

(52) U.S. Cl.
   CPC ......... *H10K 50/165* (2023.02); *H10K 30/151* (2023.02); *H10K 50/125* (2023.02);
   (Continued)

(58) Field of Classification Search
   CPC ..... H10K 50/125; H10K 30/151; H10K 71/00
   See application file for complete search history.

(56) References Cited

U.S. PATENT DOCUMENTS

| | | | | |
|---|---|---|---|---|
| 6,271,130 | B1 * | 8/2001 | Rajh | ................. H01L 21/76838 |
| | | | | 438/677 |
| 2010/0108984 | A1 | 5/2010 | Cho et al. | |

(Continued)

FOREIGN PATENT DOCUMENTS

| | | |
|---|---|---|
| CN | 1806471 A | 7/2006 |
| CN | 102364648 A | 2/2012 |

(Continued)

OTHER PUBLICATIONS

Rajh, T. et al. in "Surface Modification of Small Particle TiO2 colloids with Cysteine for Enhanced Photochemical Reduction: An EPR Study," Feb. 15, 1996, J. Phys. Chem, 1996, 100, 4538-4545. (Year: 1996).*

(Continued)

*Primary Examiner* — Michael Jung
(74) *Attorney, Agent, or Firm* — ANOVA LAW GROUP, PLLC

(57) ABSTRACT

A light-emitting device includes a first electrode, a second electrode, a light-emitting layer, and a composite material layer. The first electrode and the second electrode are arranged oppositely to each other. The light-emitting layer is arranged between the first electrode and the second electrode. The composite material layer is arranged between the second electrode and the light-emitting layer. A material for forming the composite material layer includes a titanium dioxide nanoparticle and a ligand. The ligand has a structure of (Continued)

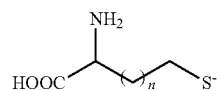

The ligand is bonded to the titanium dioxide nanoparticle by a sulfur anion. n is an integer of 0~8.

8 Claims, 3 Drawing Sheets

(51) Int. Cl.
*H10K 50/125* (2023.01)
*H10K 71/00* (2023.01)
*H10K 102/00* (2023.01)
*H10K 102/10* (2023.01)

(52) U.S. Cl.
CPC ....... *H10K 71/00* (2023.02); *H10K 2102/102* (2023.02); *H10K 2102/103* (2023.02); *H10K 2102/331* (2023.02)

(56) References Cited

U.S. PATENT DOCUMENTS

| | | | |
|---|---|---|---|
| 2013/0327386 A1* | 12/2013 | Xu | H01G 9/2036 |
| | | | 136/256 |
| 2021/0305529 A1* | 9/2021 | Lee | H10K 50/16 |
| 2022/0052262 A1* | 2/2022 | Levermore | H10K 71/811 |
| 2022/0102660 A1* | 3/2022 | Lee | H10K 50/115 |
| 2022/0194969 A1* | 6/2022 | Lee | C09K 11/02 |

FOREIGN PATENT DOCUMENTS

| | | |
|---|---|---|
| CN | 105609651 A | 5/2016 |
| CN | 109148695 A | 1/2019 |
| CN | 109205553 A | 1/2019 |
| CN | 109244243 A | 1/2019 |
| CN | 109437293 A | 3/2019 |
| JP | 2004182558 A | 7/2004 |

OTHER PUBLICATIONS

World Intellectual Property Organization (WIPO) International Search Report for PCT/CN2020/138807 Mar. 22, 2021 4 Pages (Including Translation).

* cited by examiner

LIGHT-EMITTING DEVICE HAVING COMPOSITE MATERIAL LAYER INCLUDING TITANIUM DIOXIDE NANOPARTICLE BONDED TO SULFUR ION OF AMINO ACID

CROSS-REFERENCE TO RELATED APPLICATIONS

This application is a continuation of International Application No. PCT/CN2020/138807, filed Dec. 24, 2020, which claims priority to Chinese Application No. 201911423809.4 filed Dec. 31, 2019, the entire contents of both of which are incorporated herein by reference.

TECHNICAL FIELD

The present disclosure generally relates to the display technology field and, more particularly, to a light-emitting device and a preparation method of the light-emitting device.

BACKGROUND

In recent years, the perovskite quantum dot material attracts more and more attention due to the advantages of long carrier diffusion length, high absorption coefficient, suitable forbidden band width, low exciton binding energy, etc. The perovskite quantum dot material is often used to in light-emitting devices. In a light-emitting device using the perovskite quantum dot material as the light-emitting layer material, the electron transport layer plays a very important role. The electron transport layer can form an electron selective contact with the light-emitting layer to improve the extraction efficiency of carriers and act as a carrier for electrons to flow to the cathode. Moreover, the electron transport layer can also be used as a barrier layer to block the hole backflow to improve the recombination efficiency of the holes and the electrons in the light-emitting layer of the device. Thus, the light-emitting performance of the light-emitting device is improved.

At present, in a light-emitting device uses the perovskite quantum dot material as the light-emitting layer material, a metal oxide nanoparticle is often used as a material of an electron transport layer in the light-emitting device. A titanium dioxide nanoparticle is most commonly used and has the advantages of suitable forbidden band width, good photoelectrochemical stability, etc. However, many oxygen vacancy defects exist on the surface of the titanium dioxide nanoparticle prepared in the existing technology. With the oxygen vacancies, recombination centers are easily formed at an interface between the electron transport layer and the light-emitting layer, which reduces the light-emitting efficiency of the device.

Therefore, the present light-emitting device and the preparation method thereof still need to be improved.

SUMMARY

Embodiments of the present disclosure aim to provide a light-emitting device and a preparation method thereof, which aim to solve the problem of low device light-emitting efficiency due to the fact that many oxygen vacancy defects exist on the surface of titanium dioxide nanoparticles in an existing light-emitting device.

Embodiments of the present disclosure provide a light-emitting device, including a first electrode, a second electrode, a light-emitting layer, and a composite material layer. The first electrode and the second electrode are arranged oppositely to each other. The light-emitting layer is arranged between the first electrode and the second electrode. The composite material layer is arranged between the second electrode and the light-emitting layer. A material for forming the composite material layer includes a titanium dioxide nanoparticle and a ligand. The ligand has a structure of

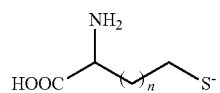

The ligand is bonded to the titanium dioxide nanoparticle by a sulfur anion. n is an integer of 0~8.

Embodiments of the present disclosure provide a preparation method of a light-emitting device. The method includes depositing a composite material on a substrate to form a composite material layer. The composite material includes a titanium dioxide nanoparticle and a ligand. The ligand has a structure of

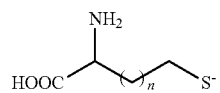

The ligand is bonded to the titanium dioxide nanoparticle by a sulfur anion. n is an integer of 0~8.

According to the light-emitting device of embodiments of the present disclosure, a composite material layer is arranged between the second electrode and the light-emitting layer. The material for forming the composite material layer includes the titanium dioxide nanoparticle and the ligand shown in Formula I. The ligand shown in Formula I includes a sulfur anion, an amino group, and a carboxyl group. The sulfur anion of the ligand may effectively occupy oxygen vacancies on the surface of the titanium dioxide nanoparticle, thereby achieving the purpose of passivating the surface oxygen vacancy defect of the titanium dioxide nanoparticle. Thus, the interface of the composite material layer in contact with the light-emitting layer is smooth. The amino group and the carboxyl group may have a high affinity with the light-emitting layer, e.g., the perovskite light-emitting layer, which can improve the interface bonding strength between the composite material layer and the light-emitting layer and even effectively passivate the surface defects of the light-emitting layer. Therefore, the interface between the composite material layer and the light-emitting layer is further optimized, so that the film quality of the light-emitting layer is effectively improved, and the nonradiative relaxation that occurs in the application process of the device is reduced. Thus, the stability and the light-emitting performance of the light-emitting device are further improved. Therefore, by modifying the titanium dioxide nanoparticle with the ligand shown in Formula I and using the composite material as the interface modification layer material bonded to the light-emitting layer, the problem of low device light-emitting efficiency caused by the presence of relatively many oxygen vacancies in the contact interface between the titanium dioxide electron transport layer and the light-emitting layer is effectively solved. Meanwhile, the contact interface between the light-emitting layer and the titanium dioxide electron transport layer in the light-emitting device is improved, and the light-emitting performance of the light-emitting device can be improved as a whole. The composite material can be applied to the fields of light-emitting diodes, fluorescent powder, photoelectric display, and have potentially high commercial value.

The preparation method of the light-emitting device of embodiments of the present disclosure includes depositing the composite material on the substrate to form the composite material layer. The material of the composite material layer includes the titanium dioxide nanoparticle and the ligand shown in Formula I. The ligand is bonded to the titanium dioxide nanoparticle by the sulfur anion. The ligand shown in Formula I has a sulfur anion, an amino group, and a carboxyl group. Under the comprehensive action of the sulfur anion, the amino group, and the carboxyl group, the problem of low device light-emitting efficiency can be effectively solved. The low device light-emitting efficiency is caused by the presence of relatively many oxygen vacancies in the contact interface between the titanium dioxide electron transport layer and the light-emitting layer. Meanwhile, the contact interface between the light-emitting layer and the titanium dioxide electron transport layer in the light-emitting device is improved. Therefore, the formed light-emitting device has good light-emitting performance, good stability, high light-emitting performance, and high carrier transport efficiency.

BRIEF DESCRIPTION OF THE DRAWINGS

In order to more clearly illustrate the technical solutions in embodiments of the present disclosure, the drawings required in embodiments or exemplary technical descriptions will be briefly introduced below. The drawings in the following description are merely some embodiments of the present disclosure, and those skilled in the art can obtain other drawings according to these drawings without creative efforts.

DETAILED DESCRIPTION OF THE EMBODIMENTS

In order to make the objectives, technical solutions, and advantages of the present disclosure clearer, the present disclosure is further described in detail below in connection with the accompanying drawings and embodiments.

Embodiments described herein are only used to explain the present disclosure and are not intended to limit the present disclosure.

In the specification of the present disclosure, the terms "first" and "second" are used for descriptive purpose only and cannot be understood as indicating or implying relative importance or implicitly indicating a number of indicated technical features. Thus, features defined with "first" and "second" may explicitly or implicitly include one or more of the feature. In the specification of the present disclosure, the term "a plurality of" means two or more, unless otherwise specified.

Figure 1:
FIG. 1 is a schematic structural diagram of a light-emitting device according to some embodiments of the present disclosure.

As shown in FIG. 1, a light-emitting device includes a first electrode 6, a second electrode 1, a light-emitting layer 4, and a composite material layer 3. The first electrode 6 and the second electrode 1 are arranged oppositely to each other. The light-emitting layer 4 is arranged between the first electrode 6 and the second electrode 1. The composite material layer 3 is arranged between the second electrode 1 and the light-emitting layer 4. A material for forming the composite material layer 3 includes a titanium dioxide nanoparticle and a ligand having a structure shown in Formula I. The ligand is bonded to the titanium dioxide nanoparticle by a sulfur anion. n may be an integer of 0~8.

Formula I

In the light-emitting device of embodiments of the present disclosure, the composite material layer is arranged between the second electrode and the light-emitting layer. The material for forming the composite material layer includes the titanium dioxide nanoparticle and the ligand shown in Formula I. The ligand includes a sulfur anion, an amino group, and a carboxyl group. The sulfur anion of the ligand may effectively occupy an oxygen vacancy on the surface of the titanium dioxide nanoparticle. Thus, the surface oxygen vacancy defect of the titanium dioxide nanoparticle may be passivated, so that an interface of the composite material layer in contact with the light-emitting layer may be flat and smooth. The amino group and the carboxyl group may have a high affinity with the light-emitting layer, such as a perovskite light-emitting layer, which may improve an interface bonding strength between the composite material layer and the light-emitting layer, and even effectively passivate the surface defects of the light-emitting layer. Therefore, the interface between the composite material layer and the light-emitting layer may be further optimized to effectively improve the film quality of the light-emitting layer and reduce nonradiative relaxation occurring in an application process of the device. Thus, the stability and the light-emitting performance of the light-emitting device may be further improved. Therefore, by modifying the titanium dioxide nanoparticle with the ligand shown in Formula I and using the composite material as a material for an interface modification layer connected to the light-emitting layer, a problem of low light-emitting efficiency of the device may be effectively solved. The low light-emitting efficiency of the device may be caused by the presence of many oxygen vacancies in a contact interface between a titanium dioxide electron transport layer and the light-emitting layer. Further, the contact interface between the light-emitting layer and the titanium dioxide electron transport layer in the light-emitting device may be improved. Therefore, the light-emitting performance of the light-emitting device may be improved as a whole. The light-emitting device of embodiments of the present disclosure may be applied to fields like light-emitting diode, fluorescent powder, and photoelectric display, and have potentially high commercial value.

In some embodiments, in the composite material layer, the sulfur anion of the ligand may be bonded to the titanium dioxide nanoparticle by occupying the oxygen vacancy on the surface of the titanium dioxide nanoparticle. Thus, by connecting the ligand to the titanium dioxide nanoparticle, the oxygen vacancy defect on the surface of the titanium dioxide nanoparticle may be effectively passivated, and the light-emitting performance of the device may be improved.

In the ligand shown in Formula I, n may be an integer of 0~8, including 0, 1, 2, 3, 4, 5, 6, 7, and 8. In some embodiments, n may be 1, and the ligand may be a product of demethylation of methionine.

In some embodiments, a material for forming the light-emitting layer may include a perovskite quantum dot. By combining the perovskite light-emitting layer with the titanium dioxide electron transport layer, an electronic selective contact may be formed to improve extraction efficiency of device carriers and effectively promote holes and electrons in the device to be recombined in the light-emitting layer to improve the light-emitting performance of the device as a whole. Moreover, the material of the composite material layer that is in contact with the light-emitting layer includes the titanium dioxide nanoparticle and the ligand shown in Formula I. The ligand as shown in Formula I includes the amino group and the carboxyl group. The amino group and the carboxyl group may have a high affinity with the perovskite quantum dot. Thus, the interface bonding strength between the composite material layer and the light-emitting layer may be improved, and the surface defect of the light-emitting layer may be even effectively passivated. Therefore, the interface between the composite material layer and the light-emitting layer may be further optimized to effectively improve the film quality of the light-emitting layer. As such, the nonradiative relaxation occurring in the application process of the device may be reduced, and the stability and the light-emitting performance of the light-emitting device may be further improved.

In some embodiments, a mass percentage of the ligand with respect to a total mass of the composite material layer may range from 0.5 to 2%.

Figure 2:
FIG. 2 is a schematic structural diagram of a light-emitting device according to some embodiments of the present disclosure.

In some embodiments, as shown in FIG. 2, a titanium dioxide layer 2 is further arranged between the second electrode 1 and the composite material layer 3. Thus, the composite material layer may form an interface modification layer between the titanium dioxide layer and the light-emitting layer to improve the interface performance of the light-emitting layer and the titanium dioxide electron transport layer in the light-emitting device and improve the light-emitting efficiency of the device.

Thicknesses of the titanium dioxide layer and the composite material layer may be flexibly adjusted according to an actual prepared product. In some embodiments, a thickness of the titanium dioxide layer may range from 100 to 200 nm. A thickness of the light-emitting layer may range from 50 to 100 nm. As such, the titanium dioxide layer may be thicker, which may facilitate carrier transport and prevent a short circuit caused by conducting an upper electrode and a lower electrode.

A particle size of the titanium dioxide nanoparticle may affect a carrier transport speed of the device. In some embodiments, the particle size of the titanium dioxide nanoparticle may range from 50 to 80 nm. When the particle size is less than 50 nm, the particle may be unstable and easy to decompose. When the particle size is greater than 80 nm, the particle may be relatively large, which may cause an uneven film and affect light-emitting.

In some embodiments, the light-emitting layer may be a light-emitting film layer of the light-emitting device. The electrons and holes may transport from the second electrode and the first electrode, respectively, to the light-emitting layer to recombine and emit light.

In some embodiments, the first electrode and the second electrode may be electrodes of the light-emitting device, such as an anode or a cathode, which may be determined according to a film layer structure of the device. In some embodiments, the second electrode may be at least one selected from, e.g., indium-doped tin oxide (ITO) conductive glass, aluminum-doped zinc oxide (ZAO) conductive glass, and fluorine-doped tin oxide (FTO) conductive glass. In some embodiments, a material of the first electrode may include at least one of aluminum, silver, gold, or platinum.

Figure 3:
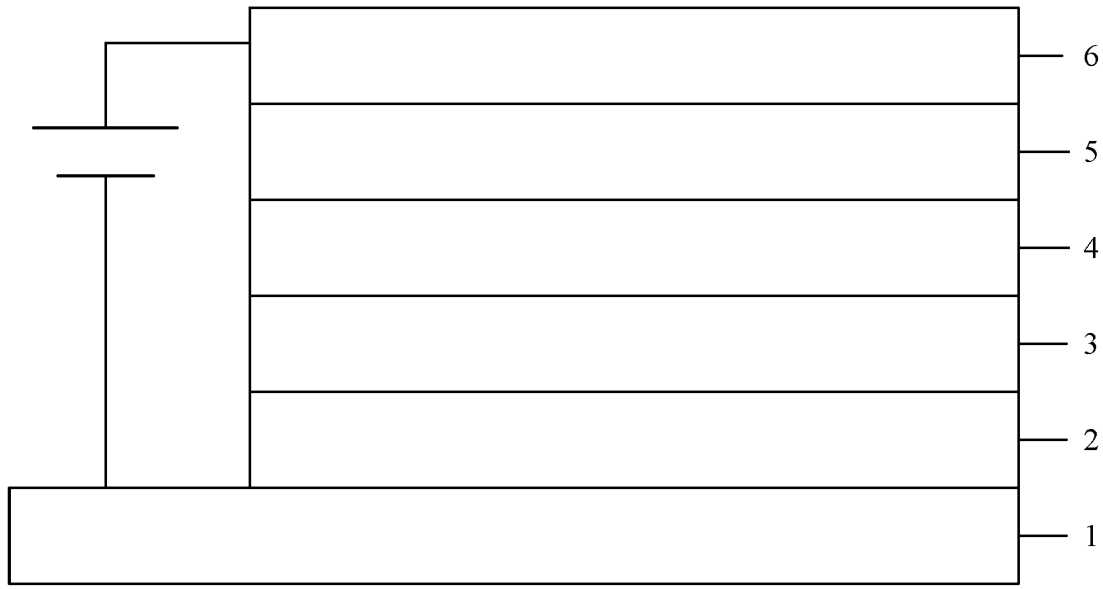
FIG. 3 is a schematic structural diagram of a light-emitting device according to some embodiments of the present disclosure.

In some embodiments, as shown in FIG. 3, the light-emitting device includes a second electrode 1, a titanium dioxide layer 2, a composite material layer 3, a light-emitting layer 4, a hole transport layer 5, and a first electrode 6 in sequence. The second electrode 1 may be the ITO conductive glass. The light-emitting layer 4 may be methylamino lead bromide (MAPbBr$_3$). The hole transport layer 5 may be poly(3,4-ethylenedioxythiophene) polystyrene sulfonate (PEDOT:PSS). The first electrode 6 may be metal aluminum.

Based on the above technical solution, embodiments of the present disclosure provide a preparation method of a light-emitting device.

Figure 4:
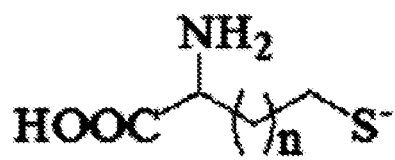
FIG. 4 is a schematic flowchart of preparing a composite material in a light-emitting device preparation method according to some embodiments of the present disclosure.

Correspondingly, as shown in FIG. 4, the preparation method of the light-emitting device includes the following processes.

At S01, a composite material is deposited on a substrate to form a composite material layer.

The composite material may include a titanium dioxide nanoparticle and a ligand shown in Formula I. The ligand may be bonded to the titanium dioxide nanoparticle by a sulfur anion. n may be an integer of 0~8.

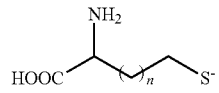

Formula I

The preparation method of the light-emitting device of embodiments of the present disclosure includes depositing a composite material on a substrate to form a composite material layer. The material of the composite material layer may include a titanium dioxide nanoparticle and a ligand shown in Formula I. The ligand is bonded to the titanium dioxide nanoparticle through a sulfur anion. The ligand shown in Formula I includes a sulfur anion, an amino group, and a carboxyl group. In a comprehensive action of the sulfur anion, the amino group, and the carboxyl group, the problem of low light-emitting efficiency of the device may be effectively solved. The low light-emitting efficiency of the device is caused by the presence of relatively large number of oxygen vacancies at the contact interface between the titanium dioxide electron transport layer and the light-emitting layer. Further, the contact interface between the light-emitting layer and the titanium dioxide electron transport layer of the light-emitting device may be improved. Therefore, the formed light-emitting device may have good light-emitting performance, good stability, high light-emitting efficiency, and high carrier transport efficiency.

The types and compositions of the titanium dioxide nanoparticle and ligand may be substantially the same as the titanium dioxide nanoparticle and ligand described above. The titanium dioxide nanoparticle and the ligand should have the same advantages and properties as the titanium dioxide nanoparticles and ligands described above, which are not repeated herein.

Figure 5:
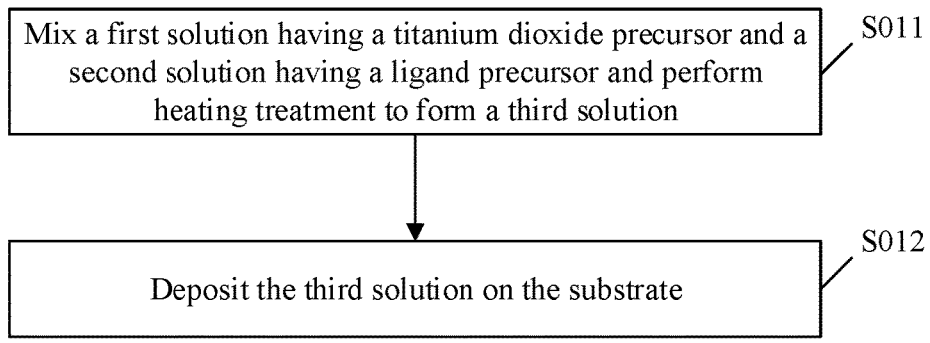
FIG. 5 is a schematic flowchart of depositing a composite material on a substrate in a light-emitting device preparation method according to some embodiments of the present disclosure.

In some embodiments, as shown in FIG. 5, depositing the composite material on the substrate includes:

mixing a first solution having a titanium dioxide precursor and a second solution having a ligand precursor and performing heating treatment to form a third solution (S011); and depositing the third solution on the substrate (S012).

In process S011, the titanium dioxide precursor and the ligand precursor are mixed to form a reaction system by mixing the first solution and the second solution. Then, the heating treatment is performed to form the ligand shown in Formula I through the liquid phase reaction. Thus, the ligand is effectively bonded to the titanium dioxide nanoparticle to obtain the third solution dispersed with the composite material.

The titanium dioxide precursor may be dissolved in the first solution. The titanium dioxide nanoparticle may be formed by a subsequent reaction. In some embodiments of the present disclosure, the titanium dioxide precursor may include titanium salt. The titanium salt may be easily soluble in water. The titanium dioxide nanoparticle with high crystallinity may be easily prepared by a hydrothermal reaction. In some embodiments, the titanium dioxide precursor may include at least one of titanium tetrachloride, titanyl sulfate, or tetrabutyl titanate.

Premature hydrolysis of the titanium dioxide precursor may need to be prevented to form a titanium dioxide sol. In some embodiments, the first solution may be a titanium salt aqueous solution formed by dissolving the titanium salt in an ice and water mixture to sufficiently mix the titanium dioxide precursor with the ligand precursor. Thus, the surface defect of the titanium dioxide nanoparticle may be effectively passivated.

The ligand precursor may be dissolved in the second solution. In some embodiments, the ligand precursor may include methionine. Through a hydrothermal reaction at 120 to 150° C. for 2 to 6 hours, the methionine may decompose to form the ligand shown in Formula I. n may be 1. In some embodiments, the second solution may be a methionine ethanol solution formed by dissolving the methionine in the ethanol.

In some embodiments, when the first solution and the second solution are mixed, the second solution may be added to the first solution in drops while the first solution is stirred to further sufficiently mix the titanium dioxide precursor with the ligand precursor. Thus, the surface defect of the titanium dioxide nanoparticle may be effectively passivated.

In some embodiments, a molar ratio of the titanium dioxide precursor to the ligand precursor may be (0.1 to 1):(2 to 8). The material prepared in this range may have better performance and is relatively suitable for preparing the device.

In some embodiments, the temperature of the heating treatment may range from 120 to 150° C., and reaction time may range from 2 to 6 hours. By controlling the temperature of the heating treatment to be 120 to 150° C. and the reaction time to be 2 to 6 hours, the ligand precursor may be ensured to decompose in the reaction to form the ligand shown in Formula I, and the sulfur anion of the ligand may effectively occupy the oxygen vacancy on the surface of the titanium dioxide particle. Thus, the surface defect of the titanium dioxide nanoparticle may be effectively passivated, and the ligand may be effectively bonded to the titanium dioxide nanoparticle.

In process S012, the third solution is deposited on the substrate to form the composite material layer on the substrate.

For the deposition method, references may be made to the conventional technique. For example, the third solution may be coated on the substrate by using a spin coating method, an inkjet printing method, etc. A suitable deposition process may be flexibly selected according to actual conditions.

To simplify the process, the substrate may be arranged in the reaction system of the composite material in advance such that the composite material synthesized by the reaction may be deposited on the substrate instantly. In some embodiments, before the heating treatment, the substrate may be added to a mixed solution of the first solution and the second solution. A surface of the substrate that is used to form the composite material layer may face a gravity direction. Further, in some embodiments, after the heating treatment, the device may be taken out, rinsed with deionized water and ethanol, and then placed on a heating table at 80 to 100° C. for an annealing treatment for 1 to 2 hours to obtain the composite material layer on the substrate.

The substrate may be used as a carrier for depositing the composite material. A suitable substrate may be selected according to an actual preparation process and the device type of the light-emitting device. In some embodiments, the second electrode may be used as the bottom electrode to prepare the light-emitting device. Then, the composite material layer, the perovskite layer, and the first electrode may be formed on the second electrode in sequence. The substrate may be used as the second electrode. In some embodiments, the first electrode may be used as the bottom electrode to prepare the light-emitting device. Then, the light-emitting layer, the composite material layer, and the second electrode may be prepared on the first electrode in sequence. The substrate may include the first electrode and the light-emitting layer formed on the first electrode.

In some embodiments, the substrate may include the second electrode. The titanium dioxide layer may be formed on the second electrode. The composite material may be formed on the titanium dioxide layer. In some embodiments, the light-emitting device may use the second electrode as the bottom electrode. The substrate may include the second electrode. The titanium dioxide layer may be formed on the second electrode. In some embodiments, the second electrode may be ITO conductive glass. Before the ITO conductive glass is used to prepare the light-emitting device, pre-treatment may be formed on the ITO conductive glass and include, firstly, performing ITO cleaning. A cotton swab may be used to dip a small amount of soap water to wipe the ITO surface to remove visible impurities. The pre-treatment may further include performing ultrasound cleaning on the ITO surface subsequently with deionized water, acetone, ethanol, and isopropanol for 15 minutes and then blow-drying the ITO conductive glass with nitrogen to get ready for use.

In addition to forming the composite material layer, the preparation method of the light-emitting device may further include forming the perovskite light-emitting layer on the composite material layer. The material of the composite material layer may include the titanium dioxide nanoparticle and the ligand shown in Formula I. The ligand shown in Formula I includes the sulfur anion, the amino group, and the carboxyl group. Thus, on one hand, the film layer of the composite material layer may be smooth, compact, and even, and have no pinhole. Leakage current caused by the direct contact between the perovskite light-emitting layer and the bottom electrode may be effectively prevented. On another hand, the film-forming performance of the perovskite quantum dot material may be improved. Thus, the perovskite light-emitting layer may have a good interface contact with the composite material layer. The film quality may be high. The film layer may be uniform and compact. The nonradiative relaxation occurring in the application process of the light-emitting device may be reduced. Thus, the performance of the device may be improved.

In order to explain the technical solutions of the present disclosure, the technical solutions are described in detail in connection with the following accompanying drawings and embodiments.

Example 1

In embodiments of the present disclosure, a light-emitting device may be prepared by the following processes.

First, the ITO cleaning may be performed. The cotton swab may be dipped with a small amount of soap water to wipe the surface of the ITO to remove visible impurities. Subsequently, the ultrasound cleaning may be performed with deionized water, acetone, ethanol, and isopropanol on the ITO for 15 minutes. Then, the ITO surface may be blow-dried with nitrogen to get ready for use.

Next, 200 mL of ice and water mixture may be prepared. 0.1 mol of $TiCl_4$ may be added to the ice and water mixture. The adding process may need to be slow to prevent the hydrolysis from being too fast. Then, 10 ml of a methionine ethanol solution may be prepared. The concentration of the methionine ethanol solution may be controlled at 200 moles per liter. Then, the methionine ethanol solution may be slowly added to the previously prepared $TiCl_4$ solution in drops. The methionine ethanol solution may be added in drops while the $TiCl_4$ solution is stirred. After the methionine ethanol solution and the $TiCl_4$ solution are stirred uniformly, the mixed solution may be poured into a hydrothermal reaction kettle. The previously cleaned ITO glass may be slowly placed into the hydrothermal reaction kettle. A front surface of the ITO glass may face upward. Then, the reaction kettle may be tightened. The hydrothermal reaction may be performed with the reaction temperature at 120° C. The reaction time may be controlled at 2 hours. After the ITO glass is naturally cooled, the ITO glass may be taken out, and carefully and slowly rinsed with deionized water and ethanol. Then, the ITO glass may be placed on a heating table at 80° C. for post-treatment for 1 hour to obtain the ITO conductive glass with the composite material layer deposited on one side of the ITO conductive glass.

Then, the perovskite quantum dot solution may be spin-coated on the composite material layer by using the spin-coating method to prepare the perovskite light-emitting layer. The hole transport layer material may be spin-coated on the perovskite light-emitting layer by using a spin-coating method to prepare the hole transport layer. Finally, the metal aluminum may be coated on the hole transport layer by adopting an evaporation method to form the aluminum electrode, so as to prepare the required perovskite quantum dot light-emitting device.

Example 2

In embodiments of the present disclosure, a light-emitting device is prepared by the following processes.

First, the ITO cleaning may be performed. The cotton swab may be dipped with a small amount of soap water to wipe the surface of the ITO to remove visible impurities. Subsequently, the ultrasound cleaning may be performed with deionized water, acetone, ethanol, and isopropanol on the ITO for 15 minutes. Then, the ITO surface may be blow-dried with nitrogen to get ready for use.

Next, 200 mL of ice and water mixture may be prepared. 1 mol of $TiCl_4$ may be added to the ice and water mixture. The adding process should be slow to prevent the hydrolysis of $TiCl_4$ too fast. Then, 20 ml of a methionine ethanol solution may be prepared. The concentration of the methionine ethanol solution may be controlled at 400 moles per liter. Then, the methionine ethanol solution may be slowly added to the previously prepared $TiCl_4$ solution in drops. The methionine ethanol solution may be added in drops while the $TiCl_4$ solution is stirred. After the methionine ethanol solution and the $TiCl_4$ solution are stirred uniformly, the mixed solution may be poured into a hydrothermal reaction kettle. The previously cleaned ITO glass may be slowly placed into the hydrothermal reaction kettle. A front surface of the ITO glass may face upward. Then, the reaction kettle may be tightened. The hydrothermal reaction may be performed with the reaction temperature at 150° C. The reaction time may be controlled at 6 hours. After the ITO glass is naturally cooled, the ITO glass may be taken out, and carefully and slowly rinsed with deionized water and ethanol. Then, the ITO glass may be placed on a heating table at 100° C. for post-treatment for 2 hours to obtain the ITO conductive glass with the composite material layer deposited on one side of the ITO conductive glass.

Then, the perovskite quantum dot solution may be spin-coated on the composite material layer by using the spin-coating method to prepare the perovskite light-emitting layer. The hole transport layer material may be spin-coated on the perovskite light-emitting layer by using a spin-coating method to prepare the hole transport layer. Finally, the metal aluminum may be coated on the hole transport layer by adopting an evaporation method to form the aluminum electrode, so as to prepare the required perovskite quantum dot light-emitting device.

Example 3

In embodiments of the present disclosure, a light-emitting device may be prepared. A difference between Example 3 and Example 1 may include depositing the titanium dioxide nanoparticle on the ITO conductive glass to form the titanium dioxide layer in the process of forming the composite material layer. Then, the composite material layer may be formed on the titanium dioxide layer according to the above processes. The remaining processes may be substantially the same as Example 1, which are not repeated here.

Comparative Example 1

A light-emitting device may be prepared in the comparative example. A difference between Comparative Example 1 and Example 3 may include removing the composite material layer. The remaining processes may be substantially the same as the processes in Example 3, which are not repeated here.

Performance Test

Figure 6:
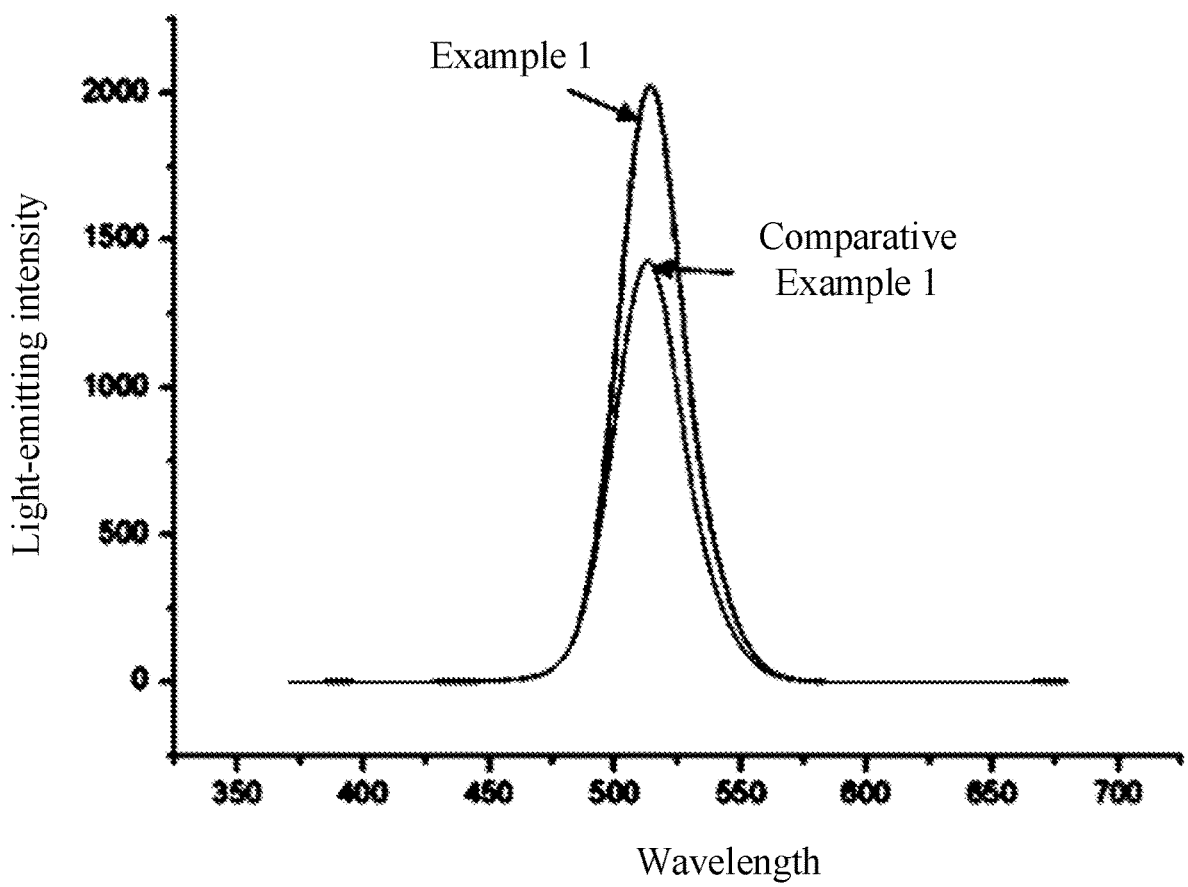
FIG. 6 is a schematic diagram showing electroluminescent spectrums of light-emitting devices of Example 1 and Comparative Example 1 according to some embodiments of the present disclosure.

1. The light-emitting devices prepared in Example 1 and Comparative Example 1 are tested, respectively, for the electroluminescent performance of the light-emitting devices. FIG. 6 is a schematic diagram of electroluminescent spectrums of light-emitting devices of Example 1 and Comparative Example 1 according to some embodiments of the present disclosure. As shown in FIG. 6, the light-emitting intensity of the light-emitting device prepared in Example 1 is significantly higher than the light-emitting intensity of the light-emitting device prepared in Comparative Example 1. Therefore, the light-emitting intensity of the light-emitting device prepared by the method of embodiments of the present disclosure may be effectively improved.

2. The light-emitting device of Example 1 and the light-emitting device of Comparative Example 1 are tested, respectively, for external quantum efficiency (EQE). The EQE of the light-emitting device prepared in Example 1 is 5.4%, which is greater than 3.2% of the EQE of the light-emitting device prepared in Comparative Example 1. Therefore, the light-emitting performance of the light-emitting device prepared by the methods of embodiments of the present disclosure may be effectively improved.

The above are merely some embodiments of the present disclosure and are not intended to limit the present disclosure. For those skilled in the art, various modifications and changes may be made to the present disclosure. Any modifications, equivalent replacements, improvements made within the spirit and principle of the present disclosure shall be within the scope of the claims of the present application.

What is claimed is:

1. A light-emitting device comprising:
   a first electrode and a second electrode arranged oppositely to each other;
   a light-emitting layer arranged between the first electrode and the second electrode; and
   a composite material layer arranged between the second electrode and the light-emitting layer, a material for forming the composite material layer including a titanium dioxide nanoparticle and a ligand, the ligand having a structure of

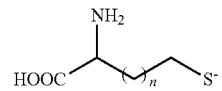

the ligand being bonded to the titanium dioxide nanoparticle by a sulfur anion, and n being an integer of 0~8;
   wherein a mass percentage of the ligand with respect to a total mass of the composite material layer ranges from 0.5 to 2%.

2. The light-emitting device according to claim 1, wherein a material for forming the light-emitting layer includes a perovskite quantum dot.

3. The light-emitting device according to claim 1, wherein the ligand is a product of demethylation of methionine.

4. The light-emitting device according to claim 1, further comprising:
   a titanium dioxide layer arranged between the second electrode and the composite material layer.

5. The light-emitting device according to claim 4, wherein:
   a thickness of the titanium dioxide layer ranges from 100 to 200 nm; and
   a thickness of the light-emitting layer ranges from 50 to 100 nm.

6. The light-emitting device according to claim 1, wherein a particle size of the titanium dioxide nanoparticle ranges from 50 to 80 nm.

7. The light-emitting device according to claim 1, wherein the second electrode includes at least one of indium-doped tin oxide conductive glass, aluminum-doped zinc oxide conductive glass, or fluorine-doped tin oxide conductive glass.

8. The light-emitting device according to claim 1, wherein the first electrode includes a metal electrode.

* * * * *